(12) United States Patent
Baik

(10) Patent No.: US 9,166,078 B2
(45) Date of Patent: Oct. 20, 2015

(54) SOLAR CELL APPARATUS AND METHOD FOR MANUFACTURING THE SAME

(75) Inventor: Jung Shik Baik, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 101 days.

(21) Appl. No.: 13/823,956

(22) PCT Filed: Oct. 25, 2011

(86) PCT No.: PCT/KR2011/007961
§ 371 (c)(1),
(2), (4) Date: Mar. 15, 2013

(87) PCT Pub. No.: WO2012/057490
PCT Pub. Date: May 3, 2012

(65) Prior Publication Data
US 2013/0174905 A1    Jul. 11, 2013

(30) Foreign Application Priority Data
Oct. 29, 2010    (KR) ........................ 10-2010-0107291

(51) Int. Cl.
*H01L 31/0224*    (2006.01)
*H01L 31/02*    (2006.01)
*H01L 31/0749*    (2012.01)
*H01L 31/046*    (2014.01)

(52) U.S. Cl.
CPC .... *H01L 31/022441* (2013.01); *H01L 31/0201* (2013.01); *H01L 31/02013* (2013.01); *H01L 31/046* (2014.12); *H01L 31/0749* (2013.01); *Y02E 10/541* (2013.01)

(58) Field of Classification Search
USPC .......................................... 136/244, 252, 256
See application file for complete search history.

(56) References Cited

U.S. PATENT DOCUMENTS

| | | | | |
|---|---|---|---|---|
| 4,773,944 | A * | 9/1988 | Nath et al. .................... | 136/249 |
| 7,122,398 | B1 * | 10/2006 | Pichler ........................... | 438/66 |
| 2009/0215224 | A1 | 8/2009 | Li et al. | |
| 2009/0242025 | A1 | 10/2009 | Kim | |
| 2010/0252109 | A1 | 10/2010 | Hong et al. | |
| 2010/0258159 | A1 | 10/2010 | Hong et al. | |
| 2011/0017279 | A1 | 1/2011 | Baumbach et al. | |

FOREIGN PATENT DOCUMENTS

| | | |
|---|---|---|
| CN | 10-1803041 A | 8/2010 |
| CN | 10-1836301 A | 9/2010 |
| JP | 61194782 A | 8/1986 |

(Continued)

OTHER PUBLICATIONS

International Search Report in International Application No. PCT/KR2011/007961, filed Oct. 25, 2011.

(Continued)

*Primary Examiner* — Susan D Leong
(74) *Attorney, Agent, or Firm* — Saliwanchik, Lloyd & Eisenschenk

(57) ABSTRACT

Disclosed are a solar cell apparatus and a method for manufacturing the same. The solar cell apparatus includes a substrate including a cell region and an outer peripheral region surrounding the cell region, a cell in the cell region, and a connection electrode connected to the cell and provided in the outer peripheral region. The cell includes a back electrode on the substrate, a light absorbing part on the back electrode, and a front electrode on the light absorbing part. The connection electrode extends from the back electrode.

12 Claims, 5 Drawing Sheets

(56) References Cited

FOREIGN PATENT DOCUMENTS

| JP | 2010-010606 A | 1/2010 |
| JP | 201027662 A | 2/2010 |
| KR | 10-2009-0102921 A | 10/2009 |
| KR | 10-2010-0109310 A | 10/2010 |
| KR | 10-2010-0109313 A | 10/2010 |
| WO | WO-2009112503 A1 | 9/2009 |

OTHER PUBLICATIONS

Chinese Office Action dated Feb. 2, 2015 in Chinese Application No. 201180005271.0.

Office Action dated Jun. 9, 2015 in Japanese Application No. 2013-536502.

\* cited by examiner

SOLAR CELL APPARATUS AND METHOD FOR MANUFACTURING THE SAME

CROSS-REFERENCE TO RELATED APPLICATIONS

This application is the U.S. national stage application of International Patent Application No. PCT/KR2011/007961, filed Oct. 25, 2011, which claims priority to Korean Application No. 10-2010-0107291, filed Oct. 29, 2010, the disclosures of each of which are incorporated herein by reference in their entirety.

TECHNICAL FIELD

The embodiment relates to a solar cell apparatus and a method for manufacturing the same.

BACKGROUND ART

A method for manufacturing a solar cell for power generation is as follows. After a substrate has been prepared, a back electrode layer is formed on the substrate and patterned by a laser, so that a plurality of back electrodes are formed.

Thereafter, a light absorbing layer, a buffer layer, and a high-resistance buffer layer are sequentially formed on the back electrodes. The light absorbing layer may be formed through various schemes such as a scheme of forming a $Cu(In,Ga)Se_2$ (CIGS) based-light absorbing layer by simultaneously or separately evaporating Cu, In, Ga, and Se and a scheme of performing a selenization process after a metallic precursor film has been formed. The energy band gap of the light absorbing layer is in the range of about 1 eV to about 1.8 eV.

Thereafter, a buffer layer including cadmium sulfide CdS is formed on the light absorbing layer through the sputtering process. The energy band gap of the buffer layer is in the range of about 2.2 eV to about 2.4 eV. Thereafter, a high-resistance buffer layer including ZnO is formed on the buffer layer through the sputtering process. The energy band gap of the high-resistance buffer layer is in the range of about 3.1 eV to about 3.3 eV.

Thereafter, groove patterns may be formed in the light absorbing layer, the buffer layer, and the high-resistance buffer layer.

Thereafter, a transparent conductive material is stacked on the high-resistance buffer layer, and the groove pattern is filled with the transparent conductive material. Accordingly, after forming a transparent electrode layer on the high-resistance buffer layer, connection wires are formed in the groove pattern. The material constituting the transparent electrode layer and the connection wires may include aluminum-doped zinc oxide. The energy band gap of the transparent electrode layer is in the range of about 3.1 eV to about 3.3 eV.

Thereafter, the groove patterns are formed in the transparent electrode layer, so that a plurality of solar cells can be formed. The transparent electrodes and the high-resistance buffers correspond to the cells. The transparent electrodes and the high-resistance buffers may be arranged in the form of a stripe or the form of a matrix.

The transparent electrodes and the back electrodes are misaligned with each other, and electrically connected to each other by the connection wires. Therefore, the solar cells can be electrically connected to each other in series.

DISCLOSURE OF INVENTION

Technical Problem

The embodiment relates to a solar cell apparatus that can be easily manufactured with improved electrical characteristics.

Solution to Problem

According to the embodiment, a solar cell apparatus includes a substrate including a cell region and an outer peripheral region surrounding the cell region, a cell in the cell region, and a connection electrode connected to the cell and provided in the outer peripheral region. The cell includes a back electrode on the substrate, a light absorbing part on the back electrode, a front electrode on the light absorbing part. The connection electrode extends from the back electrode.

According to the embodiment, a solar cell apparatus includes a substrate, a plurality of back electrode layers on the substrate, a light absorbing layer on the back electrode layers, and a front electrode layer on the light absorbing layer. The back electrode layer includes a plurality of back electrodes spaced apart from each other, and a connection electrode integrally formed with one of the back electrodes.

According to the embodiment, a method for manufacturing a solar cell apparatus includes forming a back electrode layer on a substrate including a cell region and an outer peripheral region surrounding the cell region, forming a plurality of back electrodes in the cell region, and a connection electrode in the outer peripheral region by patterning the back electrode layer, forming a light absorbing layer on the back electrodes, and forming a front electrode layer on the light absorbing layer.

Advantageous Effects of Invention

As described above, according to the solar cell apparatus of the embodiment, the cells may be connected to an external charging device or an adjacent solar cell panel through the connection electrode. In this case, the connection electrode extends from the back electrode. In particular, the connection electrode may be integrally formed with the back electrode.

Therefore, the connection resistance between the connection electrode and the back electrode can be reduced. In particular, the connection electrode may include the same material as that of the back electrode. For example, the connection electrode may include a material, such as Mo, representing low resistance.

Therefore, according to the solar cell apparatus of the embodiment, the electrical characteristics of the connection electrode can be improved, and the whole electrical characteristics of the solar cell apparatus can be improved.

Therefore, the solar cell apparatus according to the embodiment can represent improved photo-electrical conversion efficiency.

In addition, since the connection electrode can be formed when the back electrodes are formed, the connection electrode can be formed without an additional process.

In particular, since the process of bonding the bus bars to the front electrodes is not additionally required, the solar cell apparatus according to the embodiment can be easily formed.

MODE FOR THE INVENTION

Figure 1:
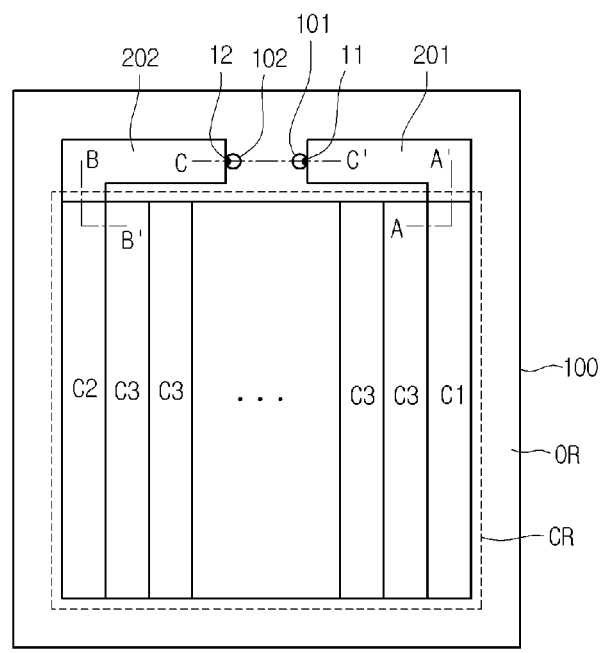
FIG. 1 is a plan view showing a solar cell module according to the embodiment.

In the description of the embodiments, it will be understood that, when a layer (or film), a region, a pattern, or a structure is referred to as being "on" or "under" another substrate, another layer (or film), another region, another pad, or another pattern, it can be directly or "undirectly" on the other substrate, layer (or film), region, pad, or pattern, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

Figure 2:
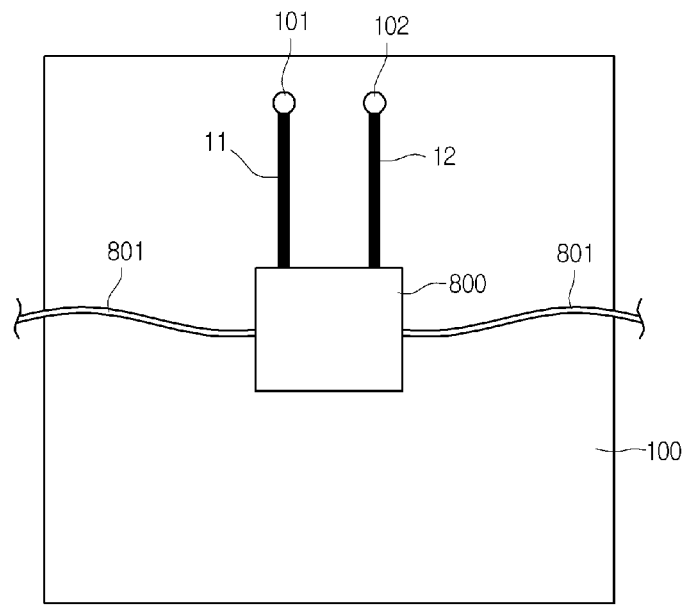
FIG. 2 is a view showing a bottom surface of the solar cell module according to the embodiment.
Figure 3:
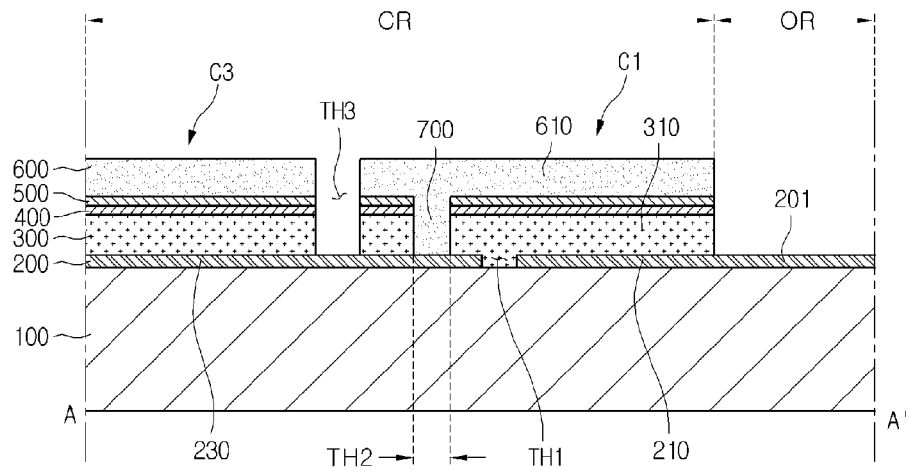
FIG. 3 is a sectional view taken along line A-A' of FIG. 1.
Figure 4:
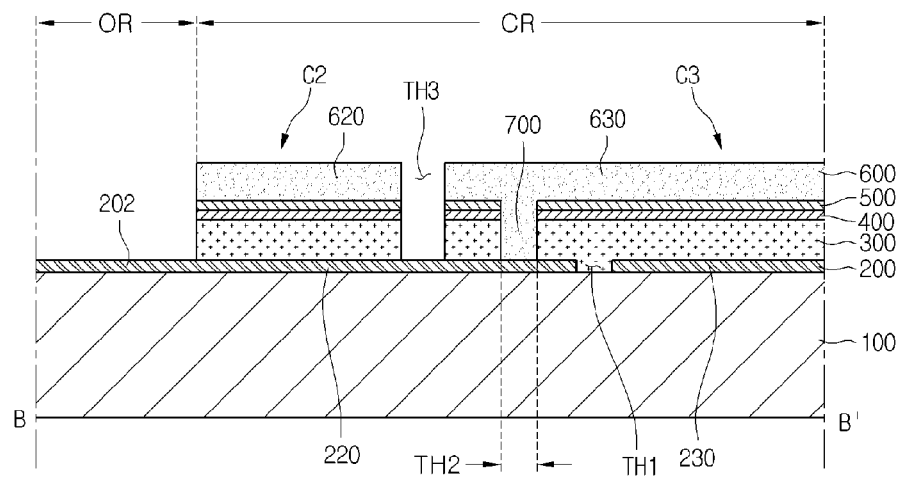
FIG. 4 is a sectional view taken along line B-B' of FIG. 1.
Figure 5:
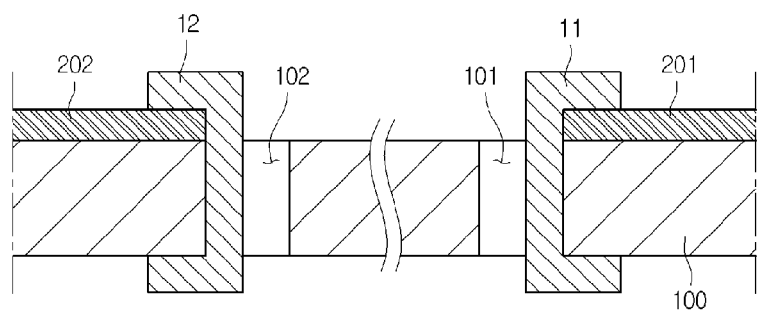
FIG. 5 is a sectional view taken along line C-C' of FIG. 1.

FIG. 1 is a plan view showing a solar cell module according to the embodiment, FIG. 2 is a view showing a bottom surface of the solar cell module according to the embodiment, and FIG. 3 is a sectional view taken along line A-A' of FIG. 1. FIG. 4 is a sectional view taken along line B-B' of FIG. 1, and FIG. 5 is a sectional view taken along line C-C' of FIG. 1.

Referring to FIGS. 1 to 5, a solar cell apparatus according to the embodiment includes a support substrate 100, a back electrode layer 200, a light absorbing layer 300, a buffer layer 400, a high-resistance buffer layer 500, a front electrode layer 600, a first bus bar 11, a second bus bar 12, and a junction box 800.

The support substrate 100 has a plate shape to support the back electrode layer 200, the light absorbing layer 300, the buffer layer 400, the high-resistance buffer layer 500, the front electrode layer 600, the first bus bar 11, the second bus bar 12, and the junction box 800.

The support substrate 100 may include an insulator. The support substrate 100 may include a glass substrate, a plastic substrate, or a metallic substrate. In detail, the support substrate 100 may include a sod lime glass substrate. The support substrate 100 may be transparent. The support substrate 100 may be rigid or flexible.

The support substrate 100 includes a cell region CR and an outer peripheral region OR. In other words, the support substrate 100 is divided into the cell region CR and the outer peripheral region OR.

The cell region CR is defined at the central portion of the support substrate 100. The cell region CR occupies most region of the support substrate 100. The solar cell apparatus according to the embodiment converts the light of the sun into electrical energy in the cell region CR.

The outer peripheral region OR surrounds the cell region CR. The outer peripheral region OR corresponds to an outer peripheral portion of the support substrate 100. The outer peripheral region OR may have a very smaller area than that of the cell region CR. The outer peripheral region OR is a region in which power is not generated.

The support substrate 100 may be formed therein with two through holes. In other words, the support substrate 100 may be formed therein with first and second through holes 101 and 102. The first and second through holes 101 and 102 are formed in the outer peripheral region OR. The through holes 101 and 102 connect the top surface of the support substrate 100 to the bottom surface of the support substrate 100.

The back electrode layer 200 is provided on the support substrate 100. The back electrode layer 200 includes a conductive layer. The back electrode layer 200 may include metal such as molybdenum (Mo). The back electrode layer 200 is formed on both of the cell region CR and the outer peripheral region OR.

The back electrode layer 200 may include at least two layers. In this case, the layers include the same metal or different metals.

The back electrode layer 200 is formed therein with first through grooves TH1. The first through grooves TH1 are open regions to expose the top surface of the support substrate 100. The first through grooves TH1 may have the shape extending in one direction when viewed in a plan view.

The width of the first through grooves TH1 may be in the range of about 80 μm to about 200 μm. The back electrode layer 200 is divided into a plurality of back electrodes 210, 220, and 230, and two connection electrodes 201 and 202 by the first through grooves TH1. In other words, the back electrodes 210, 220, and 230, and the first and second connection electrodes 201 and 202 are defined by the first through grooves TH1. The back electrode layer 200 includes the back electrodes 210, 220, and 230, and the first and second connection electrodes 201 and 202.

The back electrodes 210, 220, and 230 are provided in the cell region CR. The back electrodes 210, 220, and 230 may have a shape extending in one direction. The back electrodes 210, 220, and 230 are arranged in parallel to each other. The back electrodes 210, 220, and 230 are spaced apart from each other by the first through grooves TH1. The back electrodes 210, 220, and 230 are arranged in the form of a stripe.

In addition, the back electrodes 210, 220, and 230 may be arranged in the form of a matrix. In this case, the first through grooves TH1 may have the form of a lattice when viewed in a plan view.

The first and second connection electrodes 201 and 202 are provided in the outer peripheral region OR. In other words, the first and second connection electrodes 201 and 202 extend from the cell region CR to the outer peripheral region OR.

In detail, the first connection electrode 201 extends from the back electrode 210 of a first cell C1 to the outer peripheral region OR. The first connection electrode 201 is integrally formed with the back electrode 210 of the first cell C1. The first connection electrode 201 extends to the first through hole 101. In other words, the first connection electrode 201 extends from the back electrode 210 of the first cell C1 so that the first connection electrode 201 is adjacent to the first through hole 101. In detail, the first connection electrode 201 extends from the back electrode 210 of the first cell C1.

In addition, the first connection electrode 201 may extend to an inner side of the first through hole 101. In other words, when the back electrode layer 200 is formed, the first connection electrode 201 may be formed by depositing metal such as Mo at the inner side of the first through hole 101.

The second electrode 202 extends from the back electrode 220 of the second cell C2 to the outer peripheral region OR. In other words, the second connection electrode 202 is integrally formed with the back electrode 220 of the second cell C2. In other words, the second connection electrode 202 extends to the second through hole 102. In other words, the second connection electrode 202 extends from the back electrode 220 of the second cell C2 so that the second connection electrode 202 is adjacent to the second through hole 102. In more detail, the second connection electrode 202 extends from the back electrode 220 of the second cell C2.

In addition, the second connection electrode 202 may extend to an inner side of the second through hole 102. In other words, when the back electrode layer 200 is formed, the first connection electrode 201 may be formed by depositing metal such as molybdenum (Mo) at the inner side of the second through hole 102.

The widths of the first and second connection electrodes 201 and 202 may vary based on resistances of the first and second connection electrodes 201 and 202. For example, the widths of the first and second connection electrode 201 and 202 may be in the range of about 0.5 cm to about 5 cm.

The thicknesses of the first and second connection electrodes 201 and 202 may be identical to the thickness of the back electrodes 210, 220, and 230. For example, the thicknesses of the first and second connection electrodes 201 and 202 may be in the range of about 0.5 µm to about 2 µm.

The light absorbing layer 300 is provided on the back electrode layer 200. In detail, the light absorbing layer 300 cover the back electrodes 210, 220, and 230. The light absorbing layer 300 does not cover the first and second connection electrodes 201 and 202, but expose the first and second connection electrodes 201 and 202.

The material constituting the light absorbing layer 300 is filled in the first through grooves TH1. The light absorbing layer 300 is provided in the cell region CR. In detail, the outer peripheral portion of the light absorbing layer 300 may correspond to the outer peripheral portion of the cell region CR.

The light absorbing layer 300 may include group I-III-V compounds. For example, the first light absorbing layer 300 may have a Cu—In—Ga—Se-based crystal structure (Cu(In,Ga)Se$_2$;CIGS), a Cu—In—Se-based crystal structure, or a Cu—Ga—Se based crystal structure.

The energy band bap of the light absorbing layer 300 may be in the range of about 1 eV to about 1.8 eV.

The buffer layer 400 is provided on the light absorbing layer 300. In addition, the buffer layer 400 is provided in the cell region CR. The buffer layer 400 includes cadmium sulfide (CdS). The energy band gap of the buffer layer 400 is in the range of about 2.2 eV to about 2.4 eV.

The high-resistance buffer layer 500 is provided on the buffer layer 400. In addition, the high-resistance buffer layer 500 is provided in the cell region CR. The high-resistance buffer layer 500 includes zinc-oxide that is not doped with impurities. The energy band gap of the high-resistance buffer layer 500 is in the range of about 3.1 eV to about 3.3 eV.

The light absorbing layer 300, the buffer layer 400, and the high-resistance buffer layer 500 are formed therein with second through grooves TH2. The second through grooves TH2 pass through the light absorbing layer 300. In addition, the second through grooves TH2 are open regions to expose the top surface of the back electrode layer 200.

The second through grooves TH2 are adjacent to the first through grooves TH1. In other words, portions of the second through grooves TH2 are formed beside the first through grooves TH1 when viewed in a plan view.

The width of the second through grooves TH2 may be in the range of about 80 µm to about 200 µm.

In addition, a plurality of light absorbing parts are defined by the second through grooves TH2 in the light absorbing layer 300. In other words, the light absorbing layer 300 is divided into the light absorbing parts by the second through grooves TH2.

The buffer layer 400 is divided into a plurality of buffers by the second through grooves TH2. Similarly, the high-resistance buffer layer 500 is divided into a plurality of high-resistance buffers by the second through grooves TH2.

The front electrode layer 600 is provided above the light absorbing layer 300. The front electrode layer 600 covers the light absorbing layer 300. In addition, the front electrode layer 600 does not cover the first and second connection electrodes 201 and 202, but expose the first and second connection electrodes 201 and 202. The front electrode layer 600 is provided on the high-resistance buffer layer 500. The front electrode layer 600 is provided in the cell region CR.

The front electrode layer 600 is transparent and includes a conductive layer. The front electrode layer 600 includes an oxide. For example, the front electrode layer 600 may include zinc oxide, indium tin oxide (ITO), or indium zinc oxide (IZO).

In addition, the oxide may include conductive impurities such as aluminum (Al), alumina (Al2O3), magnesium (Mg), or gallium (Ga). In detail, the front electrode layer 600 may include Al doped zinc oxide (AZO), or Ga doped zinc oxide (GZO). The thickness of the front electrode layer 600 may be in the range of about 800 nm to about 1200 nm.

Third through grooves TH3 are formed in the light absorbing layer 300, the buffer layer 400, the high-resistance buffer layer 500, and the front electrode layer 600. The third through grooves TH3 are open regions to expose the top surface of the back electrode layer 200. For example, the widths of the through grooves TH3 may be in the range of about 80 µm to about 200 µm.

The third through grooves TH3 are adjacent to the second through grooves TH2. In detail, the third through grooves TH3 are arranged beside the second through grooves TH2. In other words, when viewed in a plan view, the third through grooves TH3 are arranged beside the second through grooves TH2.

The front electrode layers 600 are divided into a plurality of front electrodes 610, 620, and 630 by the third through grooves TH3. In other words, the front electrodes 610, 620, and 630 are defined by the third through grooves TH3.

The front electrodes 610, 620, and 630 have shapes corresponding to that of the back electrodes 210, 220, and 230. In other words, the front electrodes 610, 620, and 630 are arranged in the shape of a stripe. In addition, the front electrodes 610, 620, and 630 may be arranged in the form of a matrix.

The front electrode layer 600 includes a plurality of connection parts 700 formed by filling transparent conductive materials into the second through grooves TH2.

In addition, the first cell C1, the second cell C2, and a plurality of third cells C3 are defined by the third through grooves TH3. In detail, the first cell C1, the second cell C2, and the third cells C3 are defined by the second and third through grooves TH2 and TH3. In other words, the solar cell apparatus according to the embodiment includes the first cell C1, the second cell C2, and the third cells C3 provided on the support substrate 100.

The third cells C3 are interposed between the first cell C1 and the second cell C2. The first cell C1, the second cell C2, and the third cells C3 are connected to each other in series. In other words, the first cell C1 and the second cell C2 are outermost cells of the support substrate 100.

In addition, the first cell C1 includes the back electrode 210, the light absorbing part 310, the buffer layer 400, the high-resistance buffer layer 500, and the front electrode 610 sequentially stacked on the support substrate 100.

Similarly, the second cell C2 includes the back electrode 220, the light absorbing buffer layer 400, the high-resistance buffer layer 500, and the front electrode 620 sequentially stacked on the support substrate 100.

The connection parts 700 are provided inside the second through grooves TH2. The connection parts 700 extend downwardly from the front electrode layer 600, and are connected to the back electrode layer 200.

Therefore, the connection parts 700 connect adjacent cells to each other. In detail, the connection parts 700 connect the front and back electrodes, which are positioned at adjacent cells, respectively, to each other.

The outer peripheral portions of the light absorbing layer 300, the buffer layer 400, the high-resistance buffer layer 500, and the front electrode layer 600 may substantially match with each other. In other words, outer peripheral portions of the light absorbing layer 300, the buffer layer 400, the high-resistance buffer layer 500, and the front electrode layer 600 may correspond to each other. In this case, the outer peripheral portions of the light absorbing layer 300, the buffer layer 400, the high-resistance buffer layer 500, and the front electrode layer 600 may match with the boundary between the cell region CR and the outer peripheral region OR.

As shown in FIG. 3, the first connection electrode 201 is connected to the back electrode 210 of the first cell C1. The first cell C1 converts the light of the sun received therein into electrical energy, and is connected to the third cells C3. In other words, the first connection electrode 201 is connected to the third cells C3 through the first cell C1.

As shown in FIG. 4, the second cell C2 is a dummy cell that does not convert the light of the sun into electrical energy. The second connection electrode 202 is connected to the third cells C3 through the back electrode 220 of the second cell C2 and the connection part 700. In detail, the second connection electrode 202 is connected to the front electrode 630 of the third cell C3 adjacent to the second cell C2 through the back electrode 220 of the second cell C2 and the connection part 700.

The first bus bar 11 is provided on the outer peripheral region OR. The first bus bar 11 is provided in the first through hole 101 and on the bottom surface of the support substrate 100. The first bus bar 11 is directly connected to the first connection electrode 201. The first bus bar 11 may extend to the junction box 800. The first bus bar 11 is connected to the first cell C1 through the first connection electrode 201.

The second bus bar 12 is provided on the outer peripheral region OR. The second bus bar 12 is provided in the second through hole 102 and on the bottom surface of the support substrate 100. The second bus bar 12 is directly connected to the second connection electrode 202. The second bus bar 12 may extend to the junction box 800. The second bus bar 12 is connected to the third cell C3 through the second connection electrode 202, and the back electrode 220 of the second cell C2.

The first and second bus bars 11 and 12 include a conductor. The first and second bus bars 11 and 12 may include metal, such as silver, representing high conductivity.

The junction box 800 adheres to the bottom surface of the support substrate 100. The junction box 800 may include a circuit to drive a solar cell panel according to the embodiment. The junction box 800 may receive a diode having both ends connected to the first and second bus bars 11 and 12.

Wires 801 connected to the first and second bus bars 11 and 12 can extend from the junction box 800. The wires 801 may be connected to an adjacent solar cell panel or a charging device.

The solar cell panel according to the embodiment may connect the cells C1, C2, and C3 to an external charging device or an adjacent solar cell panel through the first and second connection electrodes 201 and 202. In this case, the first and second connection electrodes 201 and 202 may be integrally formed with the back electrodes 201 and 220 of the first and second cells C1 and C2.

Therefore, the connection resistance between the first connection electrode 201 and the back electrode 210 of the first cell C1 and the connection resistance between the second connection electrode 202 and the back electrode 220 of the second cell C2 may be reduced. In particular, the first and second connection electrodes 201 and 202 may include a material such as MO representing low resistance.

Therefore, the solar cell panel according to the embodiment can improve the electrical characteristics of the first and second connection electrodes 201 and 202. In other words, the whole electrical characteristic of the solar cell panel according to the embodiment can be improved.

Therefore, the solar cell panel according to the embodiment can represent improved photo-electro conversion efficiency.

FIGS. 6 to 14 are sectional views showing a method for manufacturing a solar cell panel according to the embodiment. The method for manufacturing the solar cell panel will be described by making reference to the description about the solar cell panel. In other words, the above description about the solar cell panel may be incorporated in the description about the method for manufacturing the solar cell panel.

Figure 6:
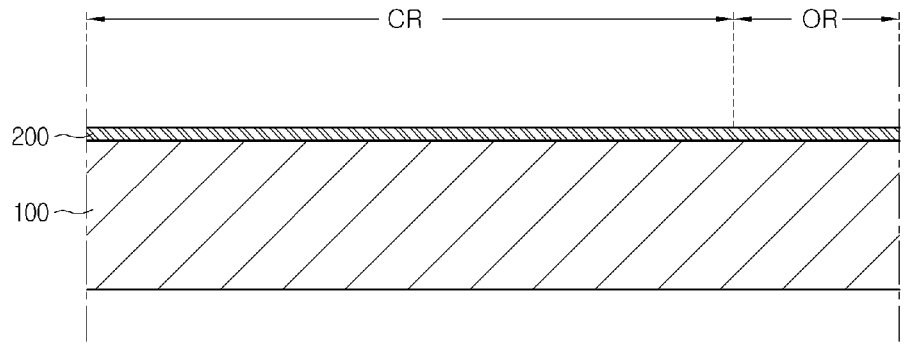
FIGS. 6 to 14 are sectional views showing the procedure of manufacturing the solar cell module according to the embodiment.

Referring to FIG. 6, the back electrode layer 200 is formed on the support substrate 100. The back electrode layer 200 may be formed by depositing metal such as Mo on the support substrate 100 through a sputtering process.

The thickness of the back electrode layer 200 may be in the range of about 0.5 μm to abut 2 μm. The back electrode layer 200 may include at least two layers, and an anti-diffusion layer may be interposed between the back electrode layer 200 and the support substrate 100.

Figure 7:
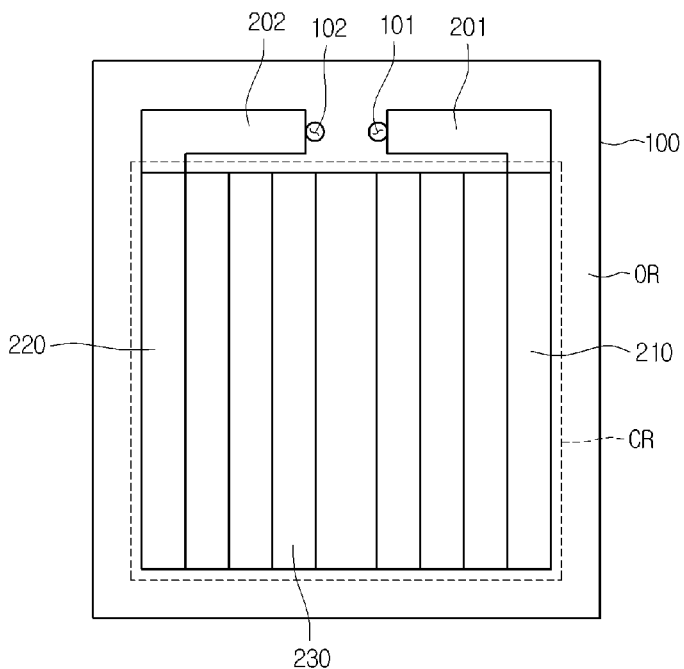
Figure 8:
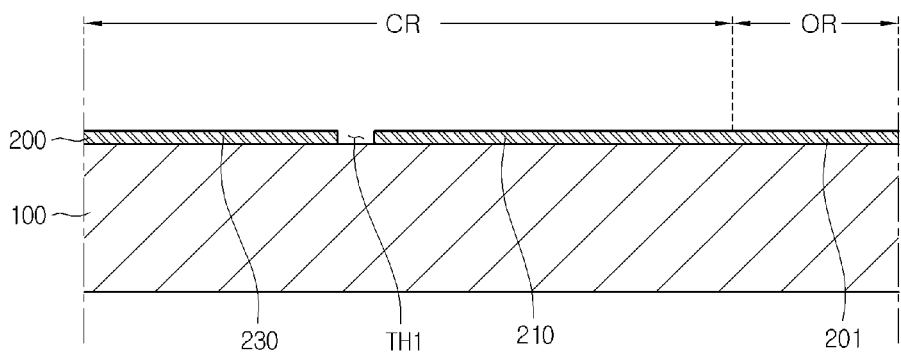

Referring to FIGS. 7 and 8, the back electrode layer 200 is patterned to form the first through grooves TH1. In addition, the edge portions of the back electrode layer 200 are patterned. Therefore, the back electrodes 210, 220, and 230, the first connection electrode 201, and the second connection electrode 202 are formed on the support substrate 100. The back electrode layer 200 may be patterned by a laser.

The first through grooves TH1 expose the top surface of the support substrate 100, and may have the width of about 80 μm to about 200 μm.

Figure 9:
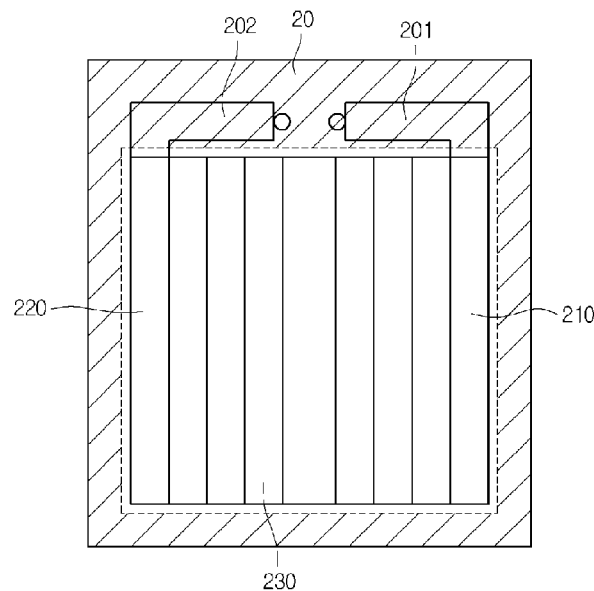
Figure 10:
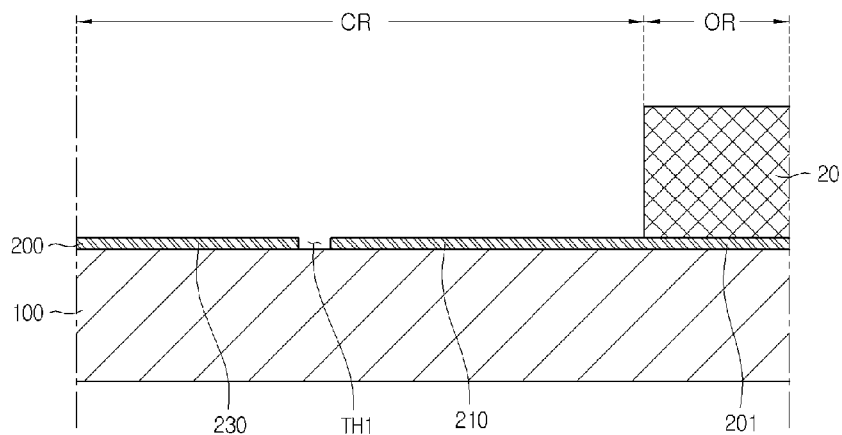

Referring to FIGS. 9 and 10, the mask 20 is formed on the support substrate 100. The mask 20 covers the outer peripheral region OR. In detail, the mask 20 covers the first and second connection electrodes 201 and 202.

The mask 20 surrounds the cell region CR of the support substrate 100. The mask 20 may have a closed loop shape or a ring shape when viewed in a plan view. The mask 20 includes a transmission region formed at the central portion.

Although the accompanying drawings show that the mask 20 closely adhere to the support substrate 100, the embodiment is not limited thereto. The mask 20 may be spaced apart from the support substrate 100 by a predetermined distance.

Figure 11:
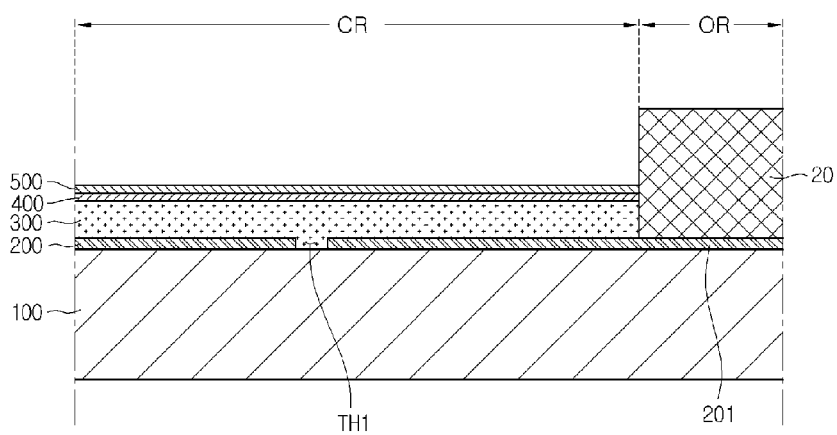

Referring to FIG. 11, the light absorbing layer 300, the buffer layer 400, and the high-resistance buffer layer 500 are formed on the back electrode layer 200. The light absorbing layer 300, the buffer layer 400, and the high-resistance buffer layer 500 are formed through the deposition process using the mask 20. Therefore, the light absorbing layer 300, the buffer layer 400, and the high-resistance buffer layer 500 are formed in the cell region CR.

In the state that the mask 20 is mounted on the support substrate 100, the light absorbing layer 300 may be formed through a sputtering process or an evaporation scheme.

For example, the light absorbing layer 300 may be formed through various schemes such as a scheme of forming a Cu(In,Ga)Se2 (CIGS) based-light absorbing layer 300 by simultaneously or separately evaporating Cu, In, Ga, and Se and a scheme of performing a selenization process after a metallic precursor film has been formed.

Regarding the details of the selenization process after the formation of the metallic precursor layer, the metallic precursor layer is formed on the back contact electrode 200 through a sputtering process employing a Cu target, an In target, or a Ga target.

Thereafter, the metallic precursor layer is subject to the selenization process so that the Cu(In,Ga)Se2 (CIGS) based-light absorbing layer 300 is formed.

In addition, the sputtering process employing the Cu target, the In target, and the Ga target and the selenization process may be simultaneously performed.

In addition, a CIS or a CIG light absorbing layer 300 may be formed through a sputtering process employing only Cu and In targets or only Cu and Ga targets and the selenization process.

Thereafter, the buffer layer 400 may be formed after depositing cadmium sulfide through a sputtering process or a CBD (chemical bath deposition) scheme in the state that the mask 20 is mounted.

Thereafter, in the state that the mask 20 is mounted, zinc oxide is deposited on the buffer layer 400 through a sputtering process, and the high-resistance buffer layer 500 is formed.

The buffer layer 400 and the high-resistance buffer layer 500 are deposited with a low thickness. For example, the thicknesses of the buffer layer 400 and the high-resistance buffer layer 500 may be in the range of about 1 nm to about 80 nm.

Figure 12:
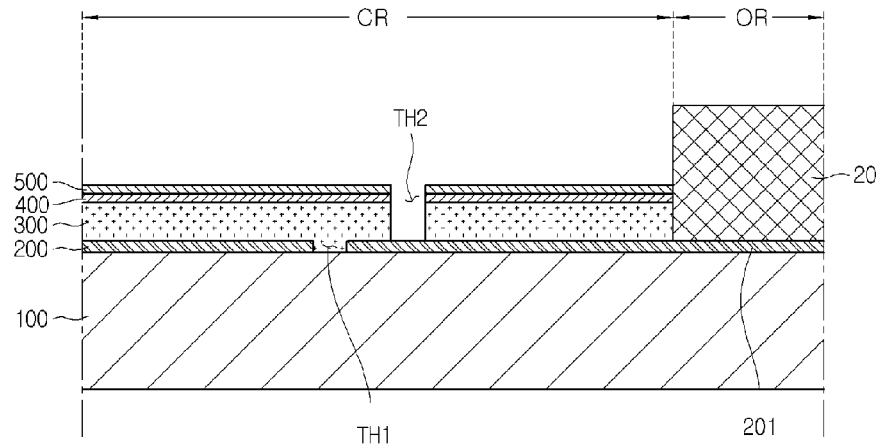

Referring to FIG. 12, the second through grooves TH2 are formed by removing portions of the light absorbing layer 300, the buffer layer 400, and the high-resistance buffer layer 500.

The second through grooves TH2 may be formed by using a mechanical device such as a tip or a laser device.

For example, the light absorbing layer 300 and the buffer layer 400 may be patterned by using the tip having a width of about 40 μm to about 180 μm. In addition, the second through grooves TH2 may be formed by the laser having a wavelength of about 200 nm to about 600 nm.

In this case, the width of the second through grooves TH2 may be in the range of about 100 μm to about 200 μm. The second through grooves TH2 expose portions of the top surface of the back electrode layer 200.

Figure 13:
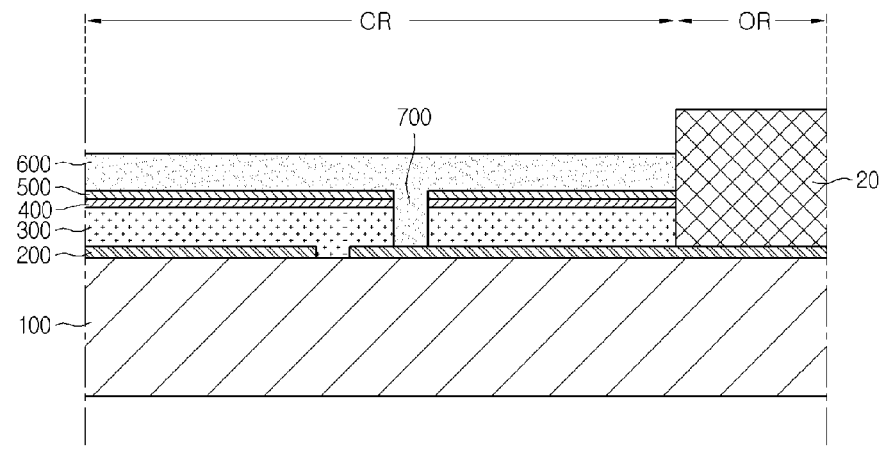

Referring to FIG. 13, the front electrode layer 600 is formed on the light absorbing layer 300 and at the inside of the second through grooves TH2 in the state that the mask 20 is mounted. In other words, the front electrode layer 600 is formed by depositing a transparent conductive material on the high-resistance buffer layer 500 and at the inside of the second through grooves TH2.

In this case, the transparent conductive material is filled inside the second through grooves TH2. The front electrode layer 600 directly makes contact with the back electrode layer 200.

Figure 14:
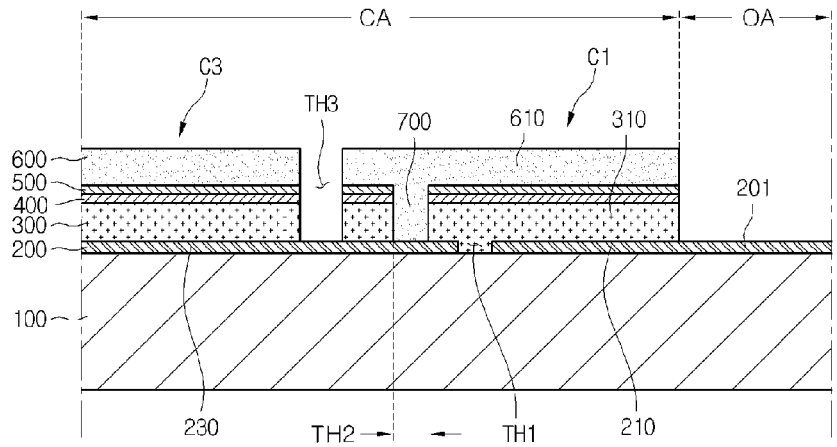

Referring to FIG. 14, the mask 20 is removed, and portions of the light absorbing layer 300, the buffer layer 400, the high-resistance buffer layer 500, and the front electrode layer 600 are removed, thereby forming the third through grooves TH3. The front electrode layer 600 is patterned to define the front electrodes 610, 620, and 630, and the first cell C1, the second cell C2, and the third cells C3. The width of the third through grooves TH3 may be in the range of about 80 μm to about 200 μm.

Thereafter, the first bus bar 11 connected to the first connection electrode 201 and the second bus bar 12 connected to the second connection electrode 202 are formed. In order to form the first bus bar 11 and the second bus bar 12, after printing conductive pastes, the printed pastes may be sintered.

The junction box 800 may adhere to the bottom surface of the support substrate 100.

As described above, the solar cell panel having improved electrical characteristics and photo-electric conversion efficiency can be manufactured.

In addition, the first and second electrodes 201 and 202 are simultaneously formed when the back electrodes 201, 220, and 230 are formed. Accordingly, the first and second connection electrodes 201 and 202 may be formed without an additional process.

Therefore, the solar cell panel according to the embodiment can be easily formed.

The solar cell panel according to the present embodiment corresponds to the solar cell apparatus. Accordingly, the description about the present embodiment is applicable to various solar cell apparatuses. In other words, the modifications of the solar cell panel according to the embodiment are applicable to various solar cell apparatuses.

Any reference in this specification to one embodiment, an embodiment, an example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell apparatus comprising:
    a substrate including a cell region and an outer peripheral region surrounding the cell region;
    a cell in the cell region; and
    a connection electrode connected to the cell and provided in the outer peripheral region,
    wherein the cell comprises:
    a back electrode on the substrate;
    a light absorbing part on the back electrode; and
    a front electrode on the light absorbing part;
    wherein the connection electrode in the outer peripheral region is formed as an extension of the back electrode disposed in the cell region,
    wherein the connection electrode is integrally formed with the back electrode, and
    wherein a thickness of the connection electrode is same as a thickness of the back electrode.

2. The solar cell apparatus of claim 1, wherein the connection electrode and the back electrode each includes molybdenum (Mo).

3. The solar cell apparatus of claim 1, further comprising a bus bar connected to the connection electrode, and extending to a bottom surface of the substrate.

4. The solar cell apparatus of claim 3, wherein the substrate is formed therein with a through hole, and the connection electrode extends toward the through hole.

5. The solar cell apparatus of claim 4, wherein the bus bar is provided on the bottom surface of the substrate and provided in the through hole.

6. The solar cell apparatus of claim 3, further comprising a junction box below the substrate, wherein the bus bar extends into the junction box.

7. A solar cell apparatus comprising:
a substrate;
a plurality of back electrode layers on the substrate;
a light absorbing layer on the back electrode layers; and
a front electrode layer on the light absorbing layer,
wherein the back electrode layers comprise:
a plurality of back electrodes spaced apart from each other; and
a connection electrode integrally formed with one of the back electrodes;
wherein the connection electrode is in an outer peripheral region and is formed as an extension of a back electrode disposed in a cell region of the substrate, and
wherein a thickness of the connection electrode is same as a thickness of the corresponding back electrode that the connection electrode is formed with.

8. The solar cell apparatus of claim 7, further comprising a bus bar below the substrate, wherein the bus bar is connected to the connection electrode.

9. The solar cell apparatus of claim 8, wherein the connection electrode has an extending shape, and the bus bar is connected to an end portion of the connection electrode.

10. The solar cell apparatus of claim 7, wherein the substrate comprises the cell region at a central portion thereof, and the outer peripheral region surrounding the cell region, and wherein the back electrodes are provided in the cell region, and the connection electrode is provided in the outer peripheral region.

11. The solar cell apparatus of claim 10, wherein the back electrodes have a shape extending in one direction and are provided in parallel to each other, and wherein the connection electrode extends from one end of the corresponding back electrode.

12. The solar cell apparatus of claim 11, wherein the back electrodes and the connection electrode each includes molybdenum (Mo).

* * * * *